United States Patent [19]

Suzuki et al.

[11] Patent Number: 4,615,102
[45] Date of Patent: Oct. 7, 1986

[54] METHOD OF PRODUCING ENHANCEMENT MODE AND DEPLETION MODE FETS

[75] Inventors: Masahisa Suzuki, Sagamihara; Takashi Mimura, Machida, both of Japan

[73] Assignee: Fujitsu Limited, Kanagawa, Japan

[21] Appl. No.: 728,080

[22] Filed: Apr. 29, 1985

[30] Foreign Application Priority Data

May 1, 1984 [JP] Japan .................................. 59-86243
Jul. 13, 1984 [JP] Japan ................................ 59-144367

[51] Int. Cl.$^4$ ............................................ H01L 21/205
[52] U.S. Cl. ......................................... 29/571; 29/577 C; 29/578; 29/580; 148/175; 148/187; 156/646
[58] Field of Search ................. 29/571, 578, 577 C, 29/580; 148/187, 175; 156/646

[56] References Cited

U.S. PATENT DOCUMENTS

| | | | |
|---|---|---|---|
| 4,371,968 | 2/1983 | Trussell et al. | 29/569 L |
| 4,523,961 | 6/1985 | Hartman et al. | 148/187 X |
| 4,545,109 | 10/1985 | Reichert | 29/578 |
| 4,575,924 | 3/1986 | Reed et al. | 29/571 X |

FOREIGN PATENT DOCUMENTS

| | | |
|---|---|---|
| 0064370 | 11/1982 | European Pat. Off. . |
| 0119089 | 9/1984 | European Pat. Off. . |
| 0143656 | 6/1985 | European Pat. Off. . |

OTHER PUBLICATIONS

Solid State Devices 1982, ESSDERC-SSSDT Meeting in Munich, 13th–16th Sep. 1982, pp. 25–50, Physik-Verlag, Weinheim D. E.; M. Abe et al., "Advanced Device Technology for High Speed GaAs VLSI".
Japanese Journal of Applied Physics, vol. 20, No. 11, Nov. 1981, pp. L847–L850, Tokyo, JP, K. Hikosaka et al., "Selective Dry Etching of AlGaAs-GaAs Heterojunction".

*Primary Examiner*—George T. Ozaki
*Attorney, Agent, or Firm*—Armstrong, Nikaido, Marmelstein & Kubovcik

[57] ABSTRACT

A semiconductor device, which comprises an E-mode FET and a D-mode FET and utilizes a two-dimensional electron gas, comprises a semi-insulating semiconductor substrate, a channel layer, an electron-supply layer, a third layer, a first etching-stoppable layer, a fifth layer, and a second etching-stoppable layer, which layers are formed in sequence on the substrate. An etching process for forming grooves of gate electrodes of the FETs comprises a first etching treatment removing the first etching-stoppable layer portion in the E-mode FET region and the second etching-stoppable layer portion in the D-mode FET region, and a second etching treatment removing the third layer portion in the E-mode FET region and the fifth layer portion and using an etchant different from that used in the first etching treatment. In the second etching treatment, reactive ion etching method using a $CCl_2F_2$ etchant gas is adopted, since GaAs can be thereby rapidly etched as compared with AlGaAs used for the etching-stoppable layer material.

26 Claims, 24 Drawing Figures

METHOD OF PRODUCING ENHANCEMENT MODE AND DEPLETION MODE FETS

BACKGROUND OF THE INVENTION

1. Field of the Invention

The present invention relates to a semiconductor device comprising an enhancement-mode (E-mode) field-effect transistor (FET) and a depletion-mode (D-mode) FET which are operated at a high speed by using a two-dimensional electron gas.

2. Description of the Related Art

In general, the above FETs comprise a semi-insulating gallium-arsenide (GaAs) substrate, an undoped GaAs channel layer, an N-type aluminum-gallium-arsenide (AlGaAs) electron-supply layer, and an N-type GaAs cap layer, which layers are successively formed on the substrate. A threshold voltage Vth of the FET depends on the thickness of a semiconductor layer including the N-type AlGaAs electron-supply layer between the undoped GaAs channel layer and a contacting bottom of a gate electrode.

Furthermore, a logic circuit, e.g., a basic inverter, comprises an enhancement/depletion (E/D) constitution consisting of an E-mode FET and a D-mode FET. In an E/D constitution semiconductor device for such a logic circuit, it is necessary to form the E-mode FET having one threshold voltage and the D-mode FET having another threshold voltage in the same semiconductor substrate.

Accordingly, where the E/D constitution semiconductor device is formed by using FETs operating at a high speed by using two-dimensional electron gas, it is necessary to form the E-mode FET and D-mode FET on the same semi-insulating substrate in such manner that the D-mode FET has a thickness of a semiconductor layer between the undoped channel layer and the contacting bottom of the gate electrode thereof different from that of the E-mode FET.

Such an E/D constitution semiconductor device has been produced by methods proposed, for example, in U.S. Ser. No. 587,967 (Filing date: Mar. 9, 1984) and U.S. Ser. No. 676,359 (Filing Note: Nov. 19, 1984) in the name of the assignee, FUJITSU LIMITED. The proposed methods utilize the additional formation of one or two thin AlGaAs layers and the adoption of a reactive ion etching (RIE) method using an etchant gas comprising $CCl_2F_2$, which will etch GaAs very rapidly as compared with AlGaAs. In such an etching, the etching rate for GaAs is about 200 times faster than that for AlGaAs.

In U.S. Ser. No. 587,967 portions in an E-mode FET region of a contact (cap) GaAs layer, an one etching stoppable AlGaAs layer, and a GaAs layer on an AlGaAs electron-supply layer are selectively etched by a wet chemical etching method to form a recess, as shown in FIG. 10. Although the GaAs layer on the AlGaAs electron-supply layer should be competely removed, a portion of the AlGaAs electron-supply layer may be etched in some of the recesses among all of the recesses in a wafer. When an E-mode FET is produced at the partially etched AlGaAs electron-supply layer, the threshold voltage of the E-mode FET varies from a predetermined value, due to variations in the thickness of the AlGaAs electron-supply layer.

In U.S. Ser. No. 676,359 after at least a contact (cap) GaAs layer and an (second) etching stoppable AlGaAs layer are selectively etched in an E-mode FET to form a recess, a reactive ion etching treatment using $CCl_2F_2$ gas is performed so as to simultaneously complete grooves for gate electrodes of the E-mode and D-mode FET's. In the etching step, at least the above-mentioned AlGaAs layer in the D-mode FET region is etched and a portion of the AlGaAs electron-supply layer in the E-mode FET region is etched. However, the etch rate for AlGaAs is, in practice, varied, and in the second embodiment, another (first) etching stoppable AlGaAs layer in GaAs layer between the former AlGaAs layer and the electron-supply layer and both the AlGaAS layers should be made to have the exactly same thickness. Such factors cause variations in the thickness of a semiconductor layer between the undoped GaAs layer and the contacting bottom of the gate electrodes, namely, variations in the threshold voltages of the E-mode and D-mode FETs. In short, the proposed producing methods cannot sufficiently attain an exact control of the groove depth for gate electrodes by etching, namely, uniformity of the threshold voltages of the E-mode and D-mode FETs formed in a wafer is relatively low.

For example, when an acceptable variation of the threshold voltage of each of the E-mode and D-mode FETs is ±50 mV, a thickness variation is ±1 nm corresponding to three atomic layers.

SUMMARY OF THE INVENTION

An object of the present invention is to provide an improved method of producing an E/D constituted semiconductor device utilizing a two-dimensional electron gas so as to accurately control the etching process and increase the uniformity of the threshold voltages of the E-mode and D-mode FETs.

Another object of the present invention is to improve the etching process for the formation of grooves for the gate electrodes of the E-mode and D-mode FETs.

The above and other objects of the present invention are attained by providing a method of producing a semiconductor device which comprises an E-mode FET and a D-mode FET and utilizing a two-dimensional electron gas, comprising the steps of: (a) forming a first semiconductor layer of a channel layer, in which the two-dimensional electron gas is generated, on a semi-insulating semiconductor substrate; (b) forming a second semiconductor layer of an electron-supply layer; (c) forming a third semiconductor layer of an adjusting layer for the threshold voltage of the D-mode transistor; (d) forming a fourth semiconductor layer of a first etching-stoppable layer; (e) forming a fifth semiconductor layer of an ohmic-contactable layer, the first to fifth layers being deposited successively on the substrate by a molecular beam epitaxy (MBE) method or a metal organic chemical vapor deposition (MOCVD) method; (f) forming a sixth layer of a second etching-stoppable layer being of a semiconductor or insulating material on the fifth layer; (g) forming a masking layer having openings, corresponding to gates of the transistors; (h) etching the sixth to third layers in the E-mode FET region and the sixth and fifth layers in the D-mode FET region to form grooves for gate electrodes of the E-mode and D-mode FET's; and (i) forming the gate electrodes by filling the grooves with a conductive material; characterized in that the etching step (h) comprises the steps of: (i) exposing a portion of the fourth semiconductor layer in the E-mode FET region and a portion of the sixth layer in the D-mode FET region through the openings; (ii) performing a first etching treatment to expose a portion of the third semiconductor layer in the E-mode FET region and a portion of the fifth semiconductor layer in the D-mode FET region; and (iii) performing a second etching treatment different from the first etching treatment to expose a portion of the second semiconductor layer in the E-mode FET region and a portion of the fourth semiconductor layer in the D-mode FET region to complete the grooves.

In short, the first etching treatment removes the portion of the fourth semiconductor layer in the E-mode FET region and the portion of the sixth layer in the D-mode FET region, and then the second etching treatment using an etchant different from that used in the first etching treatment removes the portion of the third semiconductor layer in the E-mode FET region and the portion of the fifth semiconductor layer in the D-mode FET region.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Referring to FIGS. 1 through 8, a method of producing an E/D constitution semiconductor device in accordance with a preferred first embodiment of the present invention is now explained.

Figure 1:
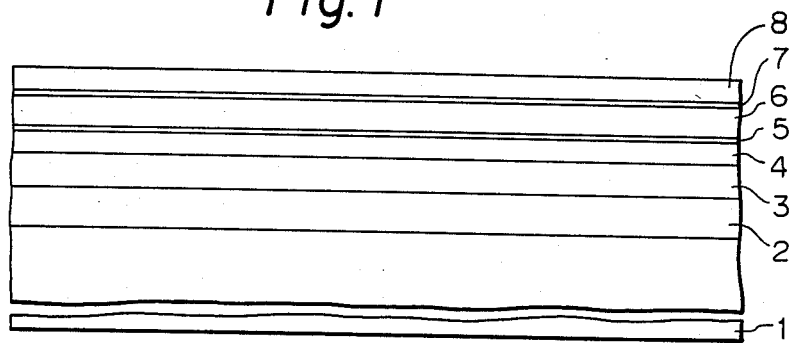
FIGS. 1 through 8 are schematic sectional views of an E/D constitution semiconductor device in various stages of production in accordance with a first embodiment of the present invention.

As illustrated in FIG. 1, on a semi-insulating GaAs substrate 1, an undoped GaAs channel layer (a first semiconductor layer) 2, an N-type AlGaAs electron-supply layer (a second semiconductor layer) 3, an N-type GaAs threshold voltage controlling layer (a third semiconductor layer) 4, an N-type AlGaAs first stoppable layer (a fourth semiconductor layer) 5, an N-type GaAs ohmic-contactable layer (a fifth semiconductor layer) 6, an N-type AlGaAs second etching-stoppable layer (a sixth semiconductor layer) 7, and an N-type GaAs ohmic-contactable layer (a seventh semiconductor layer) 8 are formed (i.e., epitaxially grown) in sequence by an MBE method or an MOCVD method.

The first undoped GaAs layer 2 has a thickness of from 50 nm to 1 μm. A two-dimensional electron gas is generated in the first layer 2 near a heterojunction interface between the first layer 2 and the second N-type AlGaAs layer 3.

The second N-type AlGaAs layer 3 has a thickness of 18 to 60 nm, preferably 30 nm, and is doped with silicon (Si) impurities of a carrier (donor) concentration of from $1 \times 10^{17}$ to $5 \times 10^{18}$ cm$^{-3}$, preferably $2 \times 10^{18}$ cm$^{-3}$. A threshold voltage of the E-mode FET substantially depends on the thickness of the second layer 3.

The third N-type GaAs layer 4 has a thickness of 2 to 50 nm, preferably 10 nm, and is doped with Si impurities of a carrier concentration similar to that of the second layer 3.

The fourth N-type AlGaAs layer 5 has a thickness of from 1.5 to 30 nm, preferably from 3 to 5 nm, and is doped with Si impurities of a carrier concentration similar to that of the second layer 3. A threshold voltage of the D-mode FET substantially depends on the total thickness of the second layer 3, third layer 4, and fourth layer 5. Therefore, a voltage difference between the threshold voltages of the E-mode and D-mode FET's depends on the thicknesses of the third layer 4 and fourth layer 5.

The fifth N-type GaAs layer 6 has a thickness of from 40 to 200 nm, preferably 80 nm, and is doped with Si impurities of a carrier concentration similar to that of the second layer 3.

The sixth N-type AlGaAs layer 7 has a thickness of from 1.5 to 30 nm, preferably from 3 to 5 nm, and is doped with Si impurities of a carrier concentration similar to that of the second layer 3. It is not necessary for the thickness of the sixth layer 6 of an etching-stoppable layer to coincide with that of the fourth layer 5.

The seventh N-type GaAs layer 8 has a thickness of from 10 to 100 nm, preferably 30 nm, and is doped with Si impurities of a carrier concentration similar to that of the second layer 3. Since AlGaAs is easily oxidized to form an insulating layer of aluminum oxide which impedes electrical contact of the AlGaAs layer with an electrode, the seventh GaAs layer 8 should be formed as a cap layer.

Figure 2:
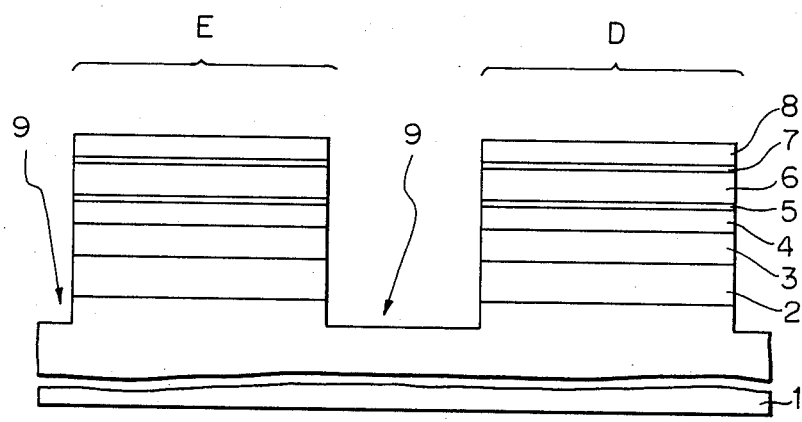

As illustrated in FIG. 2, in order to isolate the E-mode FET and the D-mode FET from each other, the semiconductor layers 8 to 2 and the semiconductor substrate 1 are selectively etched by a wet etching method using a suitable etchant, e.g., hydrofluoric acid (HF), to form a groove 9, an E-mode FET region "E" island, and a D-mode FET region "D" island. This groove 9 extends into the substrate 1. In place of the etching treatment an ion-implantation treatment can be adopted. In this case, oxygen ions or protons are doped into the portion corresponding to the groove 9 to form an insulating region (not shown).

Figure 3:
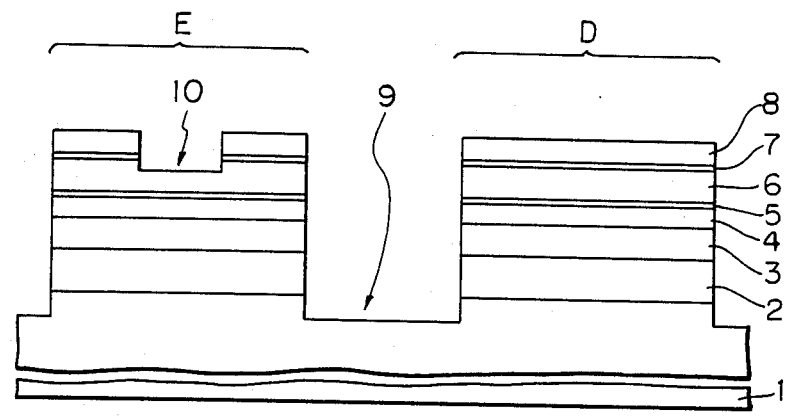

As illustrated in FIG. 3, portions of the N-type GaAs layer 8 and the N-type AlGaAs layer 7 corresponding to a gate region of the E-mode FET are etched by a suitable etching method (e.g., a wet etching method using HF solution) to form a recess 10 in the E region. In the recess 10, a portion of the N-type GaAs layer 6 is exposed and may be simultaneously etched.

Figure 9:
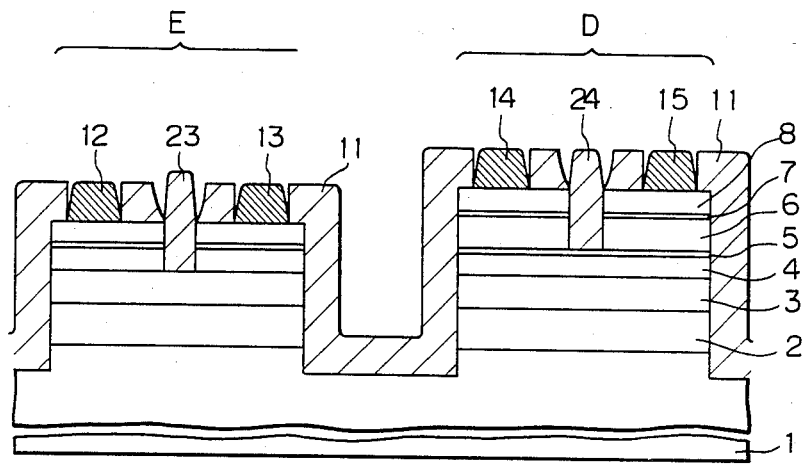
FIG. 9 is a schematic sectional view of an E/D constitution semiconductor device produced in accordance with a second embodiment of the present invention.

It is possible to completely remove the GaAs layer 8 and the AlGaAs layer 7 in the E region in this etching step. In this case, an E/D constitution semiconductor device illustrated in FIG. 9 is obtained.

Figure 4:
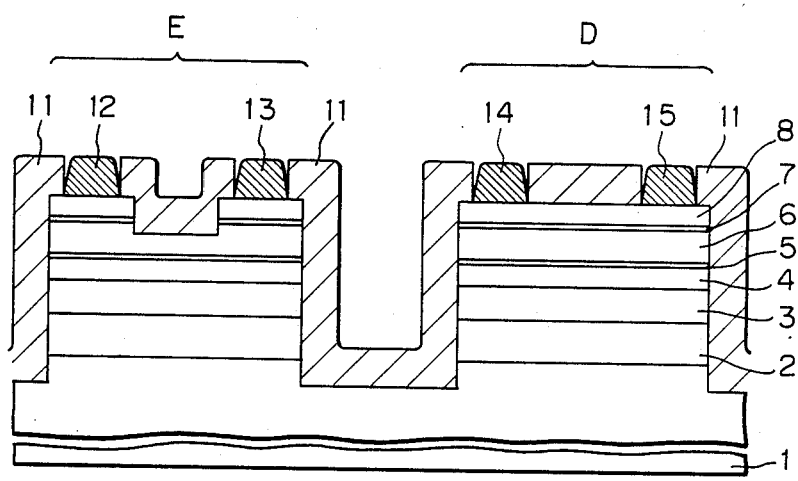

As illustrated in FIG. 4, an insulating layer 11 being of, e.g., silicon dioxide (SiO$_2$), is formed over the whole of the exposed surface by a chemical vapor deposition (CVD) method. The SiO$_2$ layer 11 has a thickness of, e.g., about 300 nm. The insulating (SiO$_2$) layer 11 is coated with a resist layer (not shown) having openings and is then selectively etched by, e.g., a wet etching method using an HF solution, to form contact openings therein. Leaving the resist layer, a metal film of AuGe/Au, AuGe/Ni/Au, AuGe/Ni, or the like is formed on the resist layer and the exposed portions of the seventh N-type GaAs layer 7 in the openings by a vapor deposition method. The resist layer is then removed by a suitable solvent, whereby a portion of the metal film on the resist layer is also removed. As the result of such a so-called lift-off process, electrode metal portions 12, 13, 14, and 15 remain on the seventh N-type GaAs layer 8. A heat treatment for alloying (e.g., at about 450° C. for 1 minute), is carried out to form ohmic-contact electrodes 12 to 15 of the source and drain electrodes of the E-mode and D-mode FETs.

Figure 5:
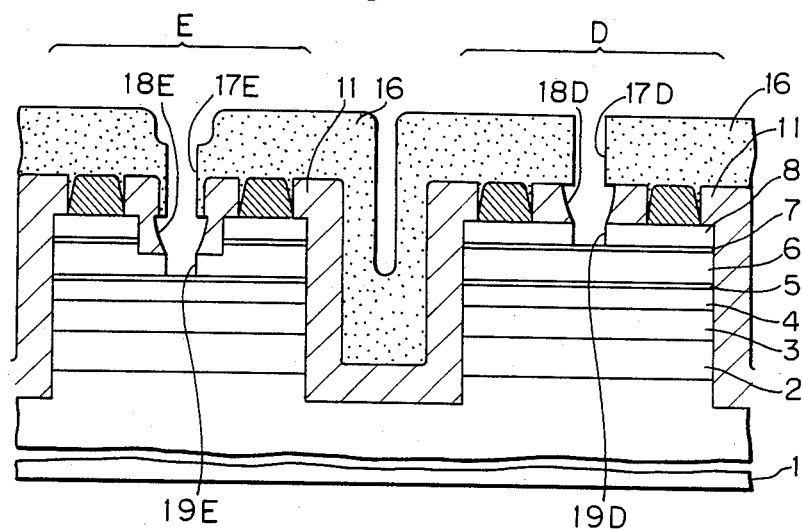

As illustrated in FIG. 5, a resist layer (a masking layer) 16 is coated, exposed, and developed to form openings 17E and 17D for the formation of grooves for gate electrodes of the E-mode and D-mode FET's, respectively. By using the resist layer 16 as a mask, the $SiO_2$ layer 11 is etched through the openings 17E and 17D by, e.g., a wet etching method using an HF solution, so that openings 18E and 18D are formed in the $SiO_2$ layer 11. Then a selective dry etching treatment, in this case a reactive ion etching (RIE) treatment using an etchant gas comprising $CCl_2F_2$, is performed so as to etch the fifth N-type GaAs layer 6 in the E region through the opening 17E and the seventh N-type GaAs layer 8 in the D region, to form openings 19E and 19D, respectively. The fourth N-type AlGaAs layer 5 in the E region and the sixth N-type AlGaAs layer 7 in the D region serve as etching-stoppable layers.

The above-mentioned RIE method using $CCl_2F_2$ gas can etch GaAs about 200 times faster than AlGaAs. The etching is automatically stopped at the surfaces of the N-type AlGaAs layers 5 and 7.

Figure 6:
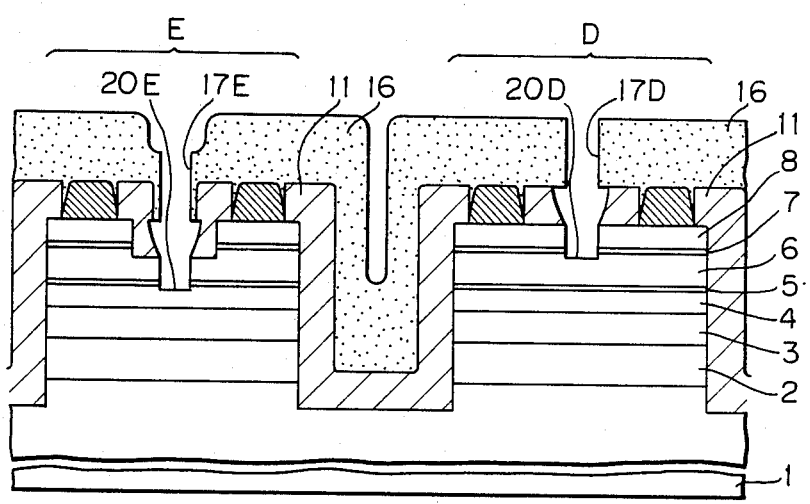

As illustrated in FIG. 6, the exposed portions of the AlGaAs layers 5 and 7 in the openings 17E to 19E and 17D to 19D are etched by, e.g., a wet etching method using an HF solution, to expose the third N-type GaAs layer 4 in the E region and the fifth N-type GaAs layer 6 in the D region. Since this etching treatment is performed for the purpose of removing a AlGaAs layer, and since the thickness of the AlGaAs layers 5 and 7 is thin, it is easy to control the etching of the AlGaAs layers 5 and 7 without the complete removal of the third and fifth GaAs layers 4 and 6. As the result of the etching, openings 20E and 20D are formed in the AlGaAs layers 5 and 7 and portions of the GaAs layer 4 and 6. It is possible to perform the etching treatment by a dry etching method using an etchant gas, e.g. Ar, He, $H_2$, or $BCl_3$ instead of the wet etching methods. And Also, it is possible to use a wet etching of a mixture of $I_2$ and KI which can etch AlGaAs about 30~40 times faster than GaAs.

Figure 7:
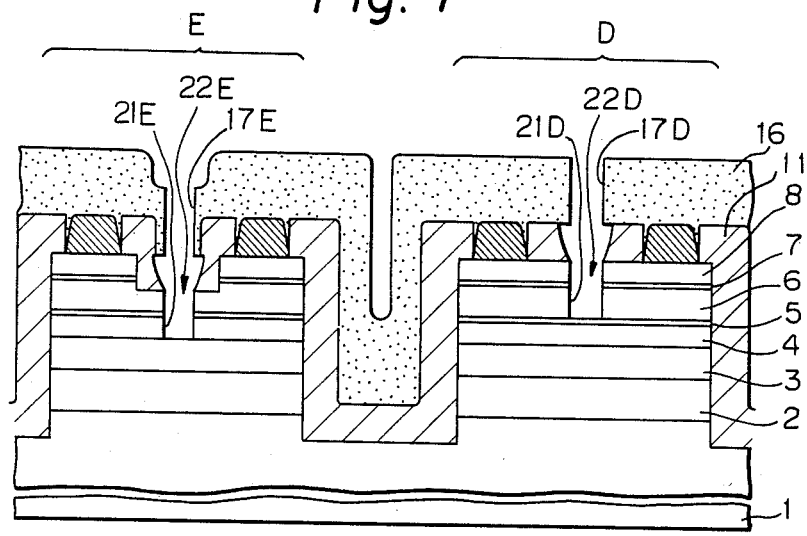

As illustrated in FIG. 7, a selective dry etching (in this case, RIE) treatment using $CCl_2F_2$ gas is performed so as to etch the third GaAs layer 4 in the E region through the opening 17E and the fifth GaAs layer 6 in the D region through the opening 17D so that openings 21E and 21D are formed, respectively. The second N-type AlGaAs layer 3 in the E region and the fourth N-type AlGaAs layer 5 in the D region serve as etching-stoppable layers. As the result of the above-mentioned etching treatments, grooves 22E and 22D consisting of the openings 18E to 21E and 18D to 21D, respectively, are completed. The point is that this etching treatment in FIG. 7 uses a different etching process from the etching for FIG. 6. By doing so, it is well controlled to set up the condition right before the starting point of the last etching process in FIG. 7 which mainly effects the threshold control of E/D mode transistors. In the present embodiment, the etching process for each layer is performed step by step so as to control the threshold voltage accurately.

In the etching process of FIG. 7, another etching process can be possible, for example, a selective dry etching of reactive ion etching using a gas $CClF_3$ or selective wet etching $H_2O_2 + NH_4OH$.

Figure 8:
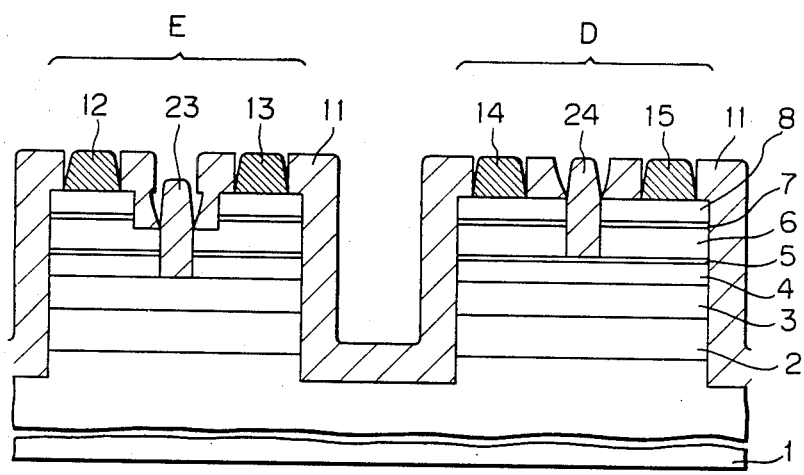

As illustrated in FIG. 8, a metal layer for Schottky barrier of, e.g., aluminum (Al), is formed by, e.g., a vapor deposition method, on the remaining resist layer 16 and in the grooves 22E and 22D. The thickness of the metal layer is, e.g., about 300 nm. The resist layer 16 is then removed by a suitable solvent, whereby a portion of the metal film on the resist layer 16 is also removed. As the result, metal portions, i.e., gate electrodes 23 and 24 of the E-mode and D-mode FETs, respectively, are formed. Therefore, a semiconductor device comprising the E-mode and D-mode FETs is obtained.

In the produced semiconductor device, the threshold voltage of the E-mode FET depends on the thickness of the second AlGaAs electron-supply layer 3, and the threshold voltage of the D-mode FET depends on the total thickness of the second, third, and fourth semiconductor layers 3, 4 and 5. The AlGaAs layers 3 and 5 are not substantially etched in the production in accordance with the present invention, accordingly accurate threshold voltages are obtained and the variation of the threshold voltages in a wafer is slight.

According to the second embodiment of the present invention, a semiconductor device illustrated in FIG. 9 is obtained. In this case, the production steps are the same as those of the above-mentioned first embodiment except that in the formation step of the recess 10 in FIG. 3 the sixth and seventh semiconductor layers 7 and 8 in the E region are completely removed.

Referring to FIGS. 10 through 18, a method of producing an E/D constituted semiconductor device in accordance with a third embodiment of the present invention is now explained.

Figure 10:
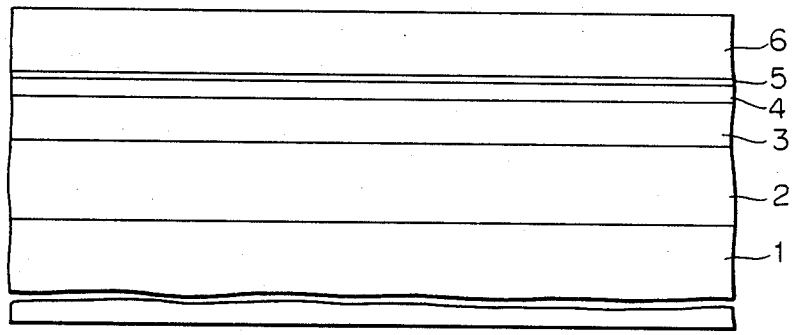
FIGS. 10 through 18 are schematic sectional views of an E/D constitution semiconductor device in various stages of production in accordance with a third embodiment of the present invention.

As illustrated in FIG. 10, the semiconductor substrate 1 and the semiconductor layers 2, 3, 4, 5 and 6 used in the first embodiment are utilized in this case.

Figure 11:
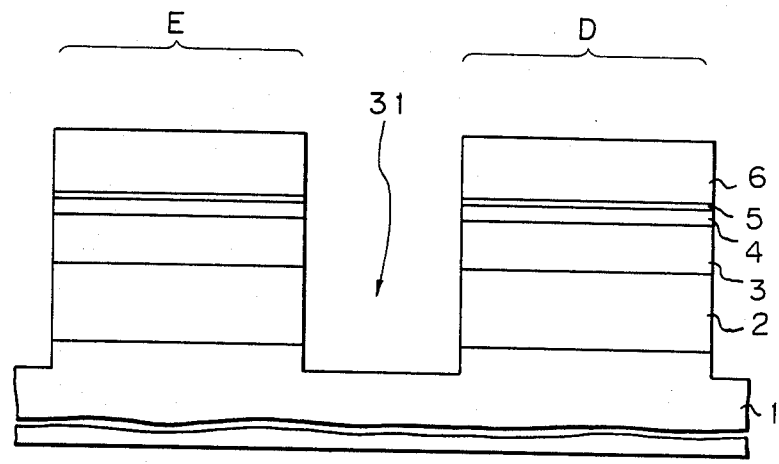

As illustrated in FIG. 11, the semiconductor layers 6 to 2 and the substrate 1 are selectively etched by a wet etching method using an HF solution to form a groove 31 for isolating an E-mode FET region "E" island and a D-mode FET region "D" island. The groove 31 extends into the substrate 1. It is possible to adopt an ion-implantation treatment for forming an isolation region instead of the groove 31.

Figure 12:
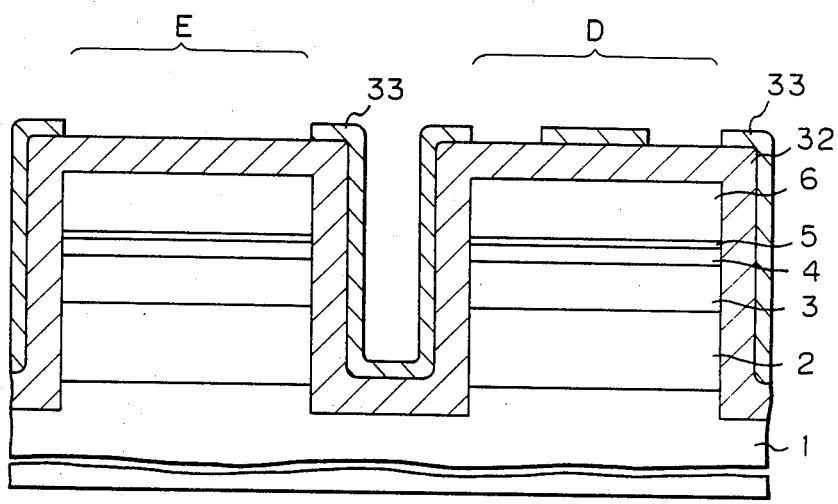

As illustrated in FIG. 12, an insulating layer 32 of, e.g., $SiO_2$, is formed over the whole of the exposed surface by a CVD method. Another insulating layer 33 of, e.g., silicon nitride ($Si_3N_4$), is formed on the insulating $SiO_2$ layer 32 by a CVD method. The thickness of the insulating layers 32 and 33 are, e.g., about 300 nm and 100 nm, respectively. Then the insulating $Si_3N_4$ layer 33 is coated with a resist layer (not shown) and is etched by, e.g., a dry etching method using an etchant gas comprising $CF_4$ gas, to form an opening corresponding to the E region and openings corresponding to source and drain electrodes of the D-mode FET.

Figure 13:
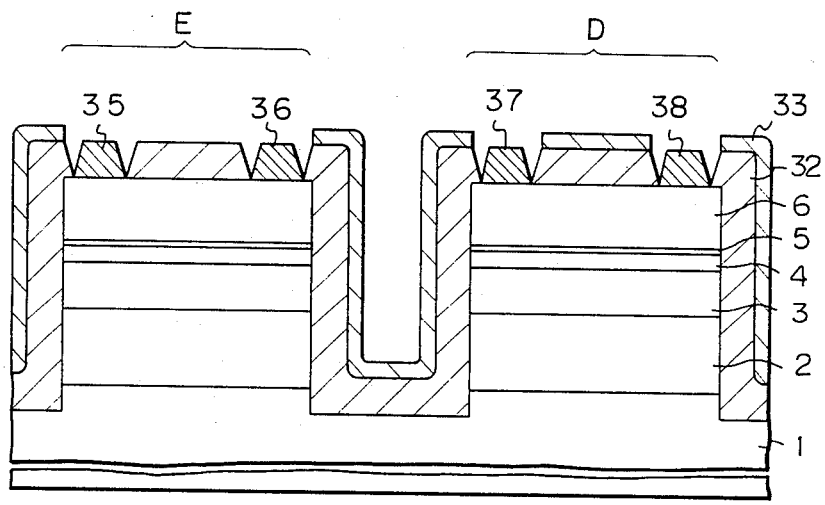

Another resist layer (not shown) having openings corresponding to the source and drain electrodes of the E-mode and D-mode FETs is formed on the exposed surface and then the insulating $SiO_2$ layer 32 is selectively etched by, e.g., a wet etching method using an HF solution, to form contact openings therein. Leaving the resist layer, a metal film of AuGe/Au or the like is formed on the resist layer and on the exposed portions of the fifth N-type GaAs layer 6 in the contact openings by a vapor deposition method. The resist layer is then removed by a suitable solvent, whereby a portion of the metal film on the resist layer is also removed. As a result, electrode metal portions 35, 36, 37, and 38 remain on the fifth GaAs layer 6, as illustrated in FIG. 13. A heat treatment for alloying is carried out to form ohmic-contact electrodes 35 to 38 of the source and drain electrodes of the E-mode and D-mode FETs.

Figure 14:
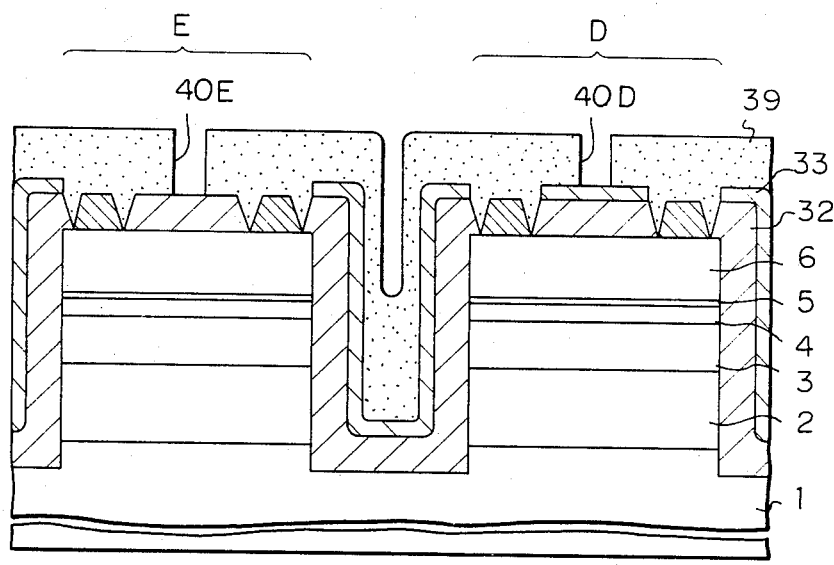

As illustrated in FIG. 14, a resist layer 39 is applied, exposed and developed to form openings 40E and 40D corresponding to gate electrodes of the FETs. In the opening 40E a portion of the insulating layer 32 is exposed and in the opening 40D a portion of the other insulating layer 33 is exposed.

Figure 15:
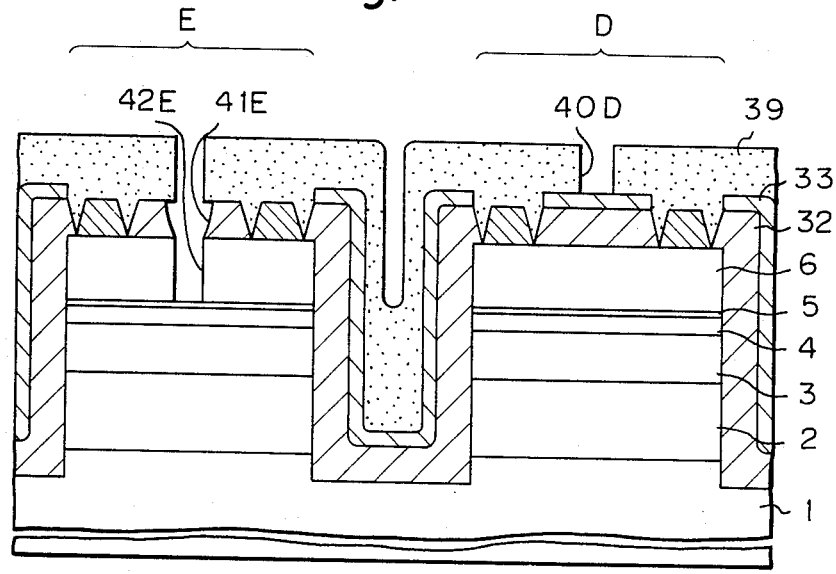

As illustrated in FIG. 15, by using a resist layer 39 as a mask, the insulating $SiO_2$ layer 32 is etched through the opening 40E by, e.g., a wet etching method using an HF solution, to form an opening 41E therein. Then the fifth GaAs layer 6 is etched through the openings 40E and 41E by a selective etching treatment (i.e., an RIE treatment) using $CCl_2F_2$ gas to form an opening 42E in which the fourth N-type AlGaAs layer 5 is exposed in the E region. The fourth AlGaAs layer 5 serves as an etching-stoppable layer. In the above-mentioned two etching steps, the other insulating $Si_3N_4$ layer 33 in the D region serves as an etching-stoppable layer.

Figure 16:
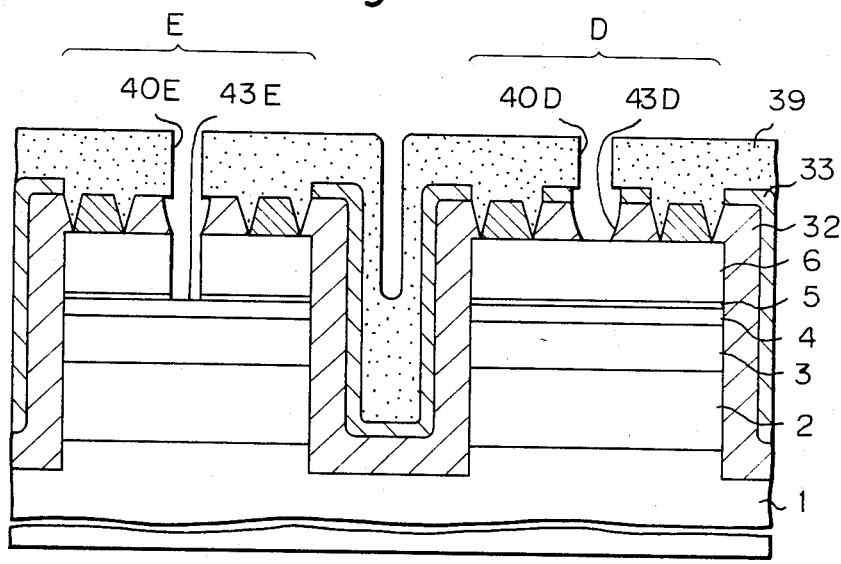

As illustrated in FIG. 16, the exposed portion of the insulating $Si_3N_4$ layer 33 in the D region is etched by a wet etching method using a phosphoric acid ($H_3PO_4$) solution to expose the insulating layer 32, and then the exposed portion of the fourth AlGaAs layer 5 in the opening 40E and the insulating layer 32 in the D region are simultaneously etched by a wet etching method using an HF solution to form openings 43E and 43D, respectively. In the opening 43D a portion of the third N-type GaAs layer 4 is exposed and in the opening 43D a portion of the fifth GaAs layer 6 is exposed. Since the fourth AlGaAs layer 5 is thin, it is easy to control the etching of the AlGaAs layer without the complete removal of the third GaAs layer 4. It is possible to perform the etching treatment by a dry etching method instead of the wet etching method.

Figure 17:
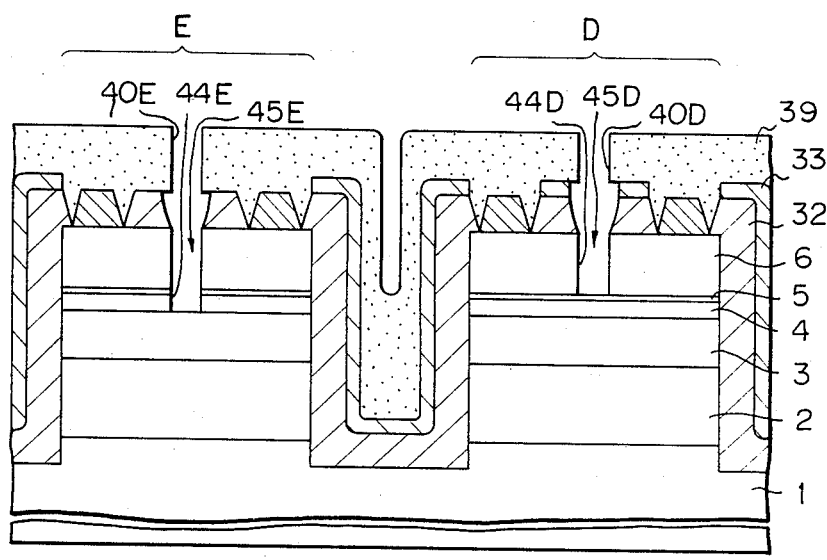

As illustrated in FIG. 17, a selective dry etching (in this case, RIE) treatment using $CCl_2F_2$ gas is performed to etch the third GaAs layer 4 through the opening 40E and the fifth GaAs layer 6 through the opening 40D, so that openings 44E and 44D are formed, respectively. The second N-type AlGaAs layer 3 in the E region and the fourth N-type AlGaAs layer 5 in the D region serve as etching-stoppable layers. As the result of the above-mentioned etching treatments, grooves 45E and 45D consisting of the openings 41E, 42E, 43E, and 44E, and 43D and 44D, respectively, are completed.

Figure 18:
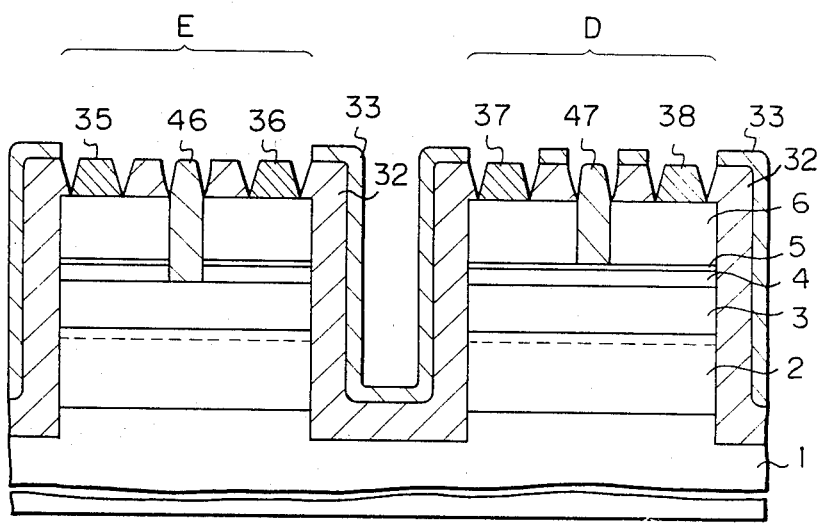

As illustrated in FIG. 18, a metal layer for a Schottky barrier, e.g., of Al, is formed by a vapor deposition method on the remaining resist layer 39 and in the grooves 45E and 45D. The thickness of the Al layer is, e.g., about 300 nm. The resist layer 39 is then removed by a suitable solvent, whereby a portion of the metal layer on the resist layer 39 is also removed. As a result, metal portions, i.e., gate electrodes 46 and 47 of the E-mode and D-mode FETs, are formed. Therefore, a semiconductor device comprising E-mode and D-mode FETrs is obtained.

Referring to FIGS. 19 through 24, a method of producing an E/D constitution semiconductor device in accordance with a fourth embodiment of the present invention is now explained. The production steps of the fourth embodiment are similar to those of the third embodiment. Thus, the same reference numerals used in the fourth embodiment as those used in the third embodiment indicate the same elements.

Figure 19:
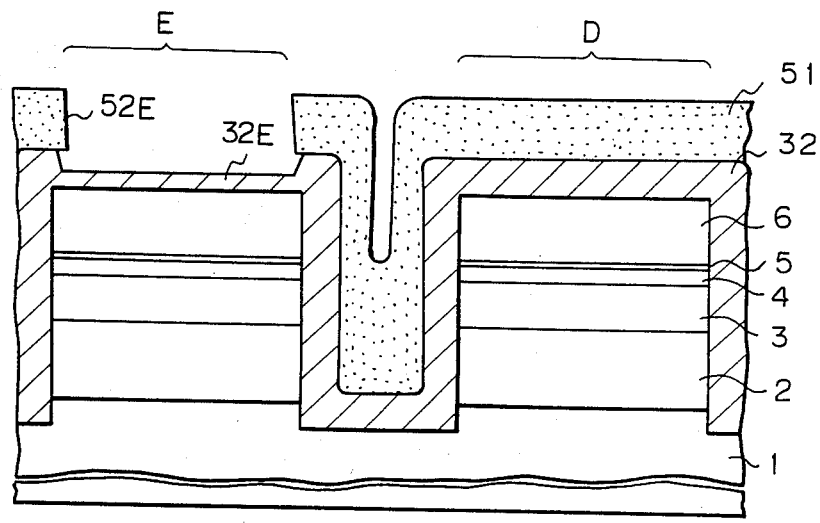
FIGS. 19 through 24 are schematic sectional views of an E/D constitution semiconductor device in various stages of production in accordance with a fourth embodiment of the present invention.

After the insulating (e.g., $SiO_2$) layer 32 is formed over the whole of the exposed surface including the groove 31, as shown in FIG. 12, a resist layer 51 with an opening 52E is formed on the insulating $SiO_2$ layer 32, as illustrated in FIG. 19. Then the insulating $SiO_2$ layer 32 is etched by a wet etching method using an HF solution to decrease the thickness thereof (e.g., about 300 nm). The decreased insulating portion 32E in the E region has a thickness of, e.g., about 200 nm.

The resist layer 51 is removed and another resist layer (not shown) is then formed on the insulating layer 32 including the decreased portion 32E. This other resist layer has openings corresponding to source and drain electrodes of the FETs. The insulating layer is selectively etched by a wet etching method using an HF solution to form contact openings therein. A metal layer of AuGe/Au or the like is deposited on the resist layer and in the contact openings and then the resist layer, together with a portion of the metal layer thereon, is removed. As a result, the source and drain electrodes 35, 36, 37, and 38 are formed.

Figure 20:
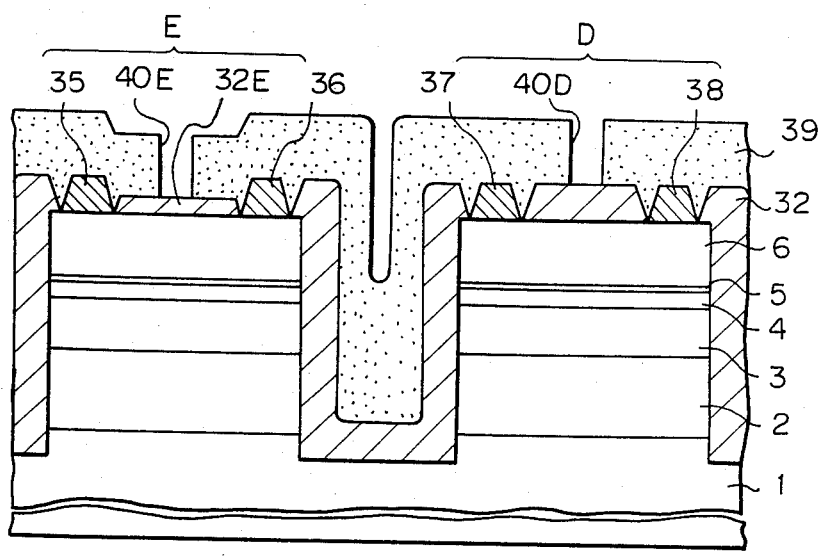

As illustrated in FIG. 20, the resist layer 39 having the openings 40D and 40E is formed on the insulating layer 32 and the electrodes 35 to 38.

Figure 21:
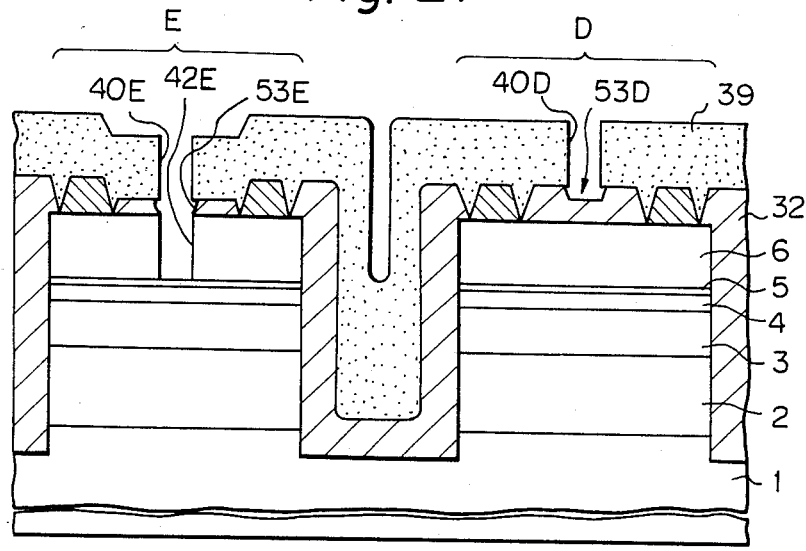

As illustrated in FIG. 21, a wet etching treatment using an HF solution is performed to etch the decreased insulating $SiO_2$ portion 32E through the opening 40E to form an opening 53E. At the same time the insulating layer 32 in the D region is also etched to form a recess 53D. In this etching treatment the insulating layer 32 in the D region must not be completely etched. Thereafter, a selective dry etching (i.e., RIE) treatment using $CCl_2F_2$ gas is performed to etch the fifth N-type GaAs layer 6 through the opening 40E. The opening 42E is formed in the fifth GaAs layer 6, and a portion of the fourth AlGaAs layer 4 is exposed in the opening 42E. In the latter etching step, the fourth AlGaAs layer 4 and the insulating $SiO_2$ layer 32 serve as etching-stoppable layers.

Figure 22:
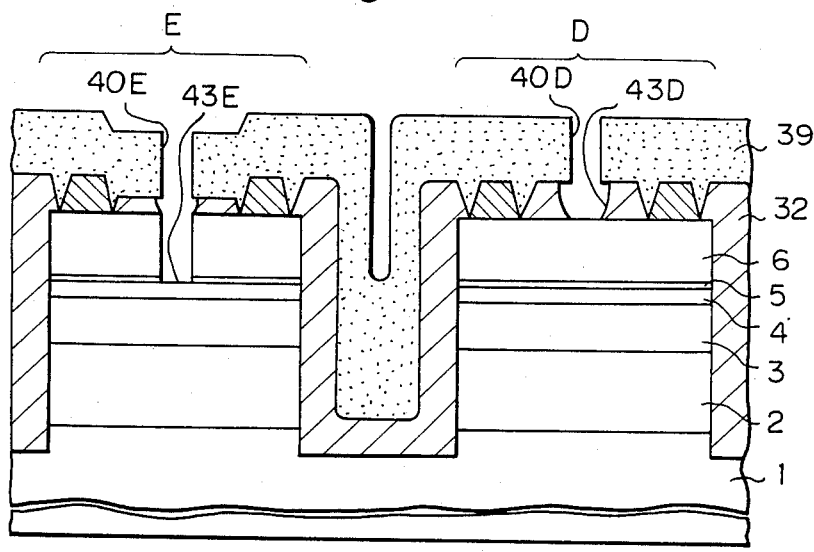

As illustrated in FIG. 22, the exposed portion of the fourth AlGaAs layer 5 in the opening 40E and the insulating $SiO_2$ layer 32 in the opening 40D are etched by a wet etching method using an HF solution to form the openings 43E and 43D, respectively. A portion of the third N-type GaAs layer 4 is exposed in the opening 43E, and a portion of the fifth GaAs layer 6 is exposed in the opening 43D.

Figure 23:
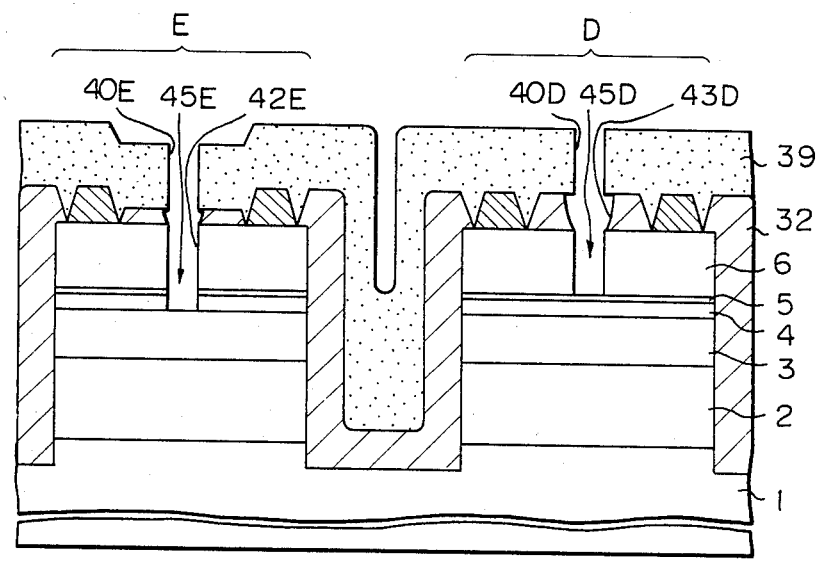

As illustrated in FIG. 23, a selective dry etching (in this case, RIE) treatment using $CCl_2F_2$ gas is performed to etch the third GaAs layer 4 and the fifth GaAs layer 6. The second N-type AlGaAs layer 3 in the E region and the fourth N-type AlGaAs layer 5 in the D region serve as etching-stoppable layers. As a result, grooves 45E and 45D for gate electrodes of the E-mode and D-mode FETs are completed.

Figure 24:
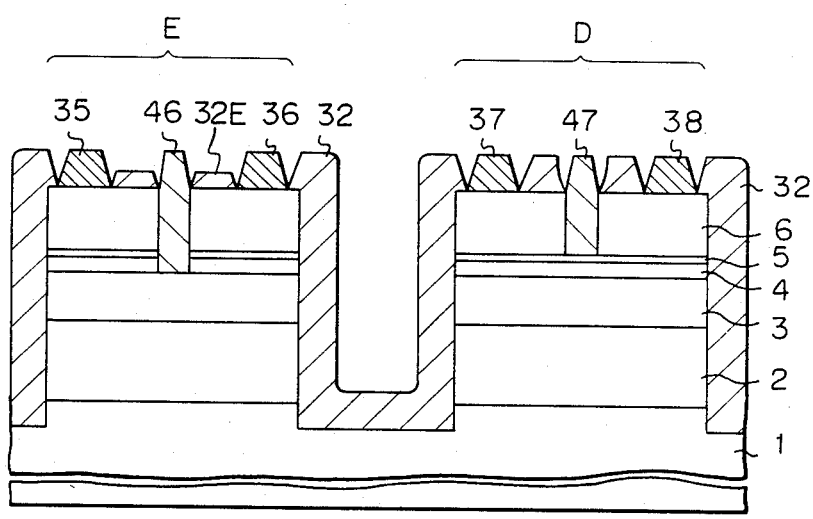

As illustrated in FIG. 24, a metal layer of, e.g., Al, is formed on the resist layer 39 and in the grooves 45E and 45D. Then the resist layer 39 is removed by a suitable solvent, whereby a portion of the metal layer on the resist layer 39 is also removed. As a result, metal portions, i.e., gate electrodes 46 and 47 of the FETs, are formed. Therefore, a semiconductor device comprising the E-mode and D-mode FETs is obtained.

It will be obvious that the present invention is not restricted to the above-mentioned embodiments and that many variations are possible for those skilled in the art without departing from the scope of the present invention. For example, if the electron affinity of the second (electron supply) layer 3 is greater than that of the first (channel) layer 2 and the lattice constant of the second layer 3 is equal or similar to that of the first layer 2, germanium (Ge), indium-antimonide (InSb), or indium-arsenide (InAs) may be used for the first layer 2 and AlGaAs, GaAs, cadmium-telluride (CdTe), or gallium-antimonide (GaSb) may be used for the second layer 3. It is possible to use combinations of Ge (first layer) and AlGaAs (second layer), Ge and GaAs, InSb and CdTe, and InAs and GaSb in addition to the combination of GaAs and AlGaAs. The layers 4 and 6 may be made of Ge, InSb, or InAs, and the layers 5 and 7 may be made of AlGaAs, CdTe, or GaSb. It is possible to adopt a suitable etchant in accordance with compound semiconductor materials used for a semiconductor device in the embodiments of the present invention.

We claim:

1. A method of producing a semiconductor device which comprises an enhancement-mode transistor and a depletion-mode transistor and utilizes a two-dimensional electron gas, comprising the steps of:
   (a) forming a first semiconductor layer of a channel layer, in which the two-dimensional electron gas is generatable, on a semi-insulating semiconductor substrate;
   (b) forming a second semiconductor layer of an electron-supply layer on the first semiconductor layer;
   (c) forming a third semiconductor layer of an adjusting layer for the threshold voltage of the depletion-mode transistor on the second semiconductor layer;
   (d) forming a fourth semiconductor layer of a first contact layer on the third semiconductor layer;
   (e) forming a fifth semiconductor layer of a contact layer on the fourth semiconductor layer;
   (f) forming a sixth layer of a second etching-stoppable layer on the fifth semiconductor layer;
   (g) forming a masking layer having openings corresponding to gates of the enhancement-mode and depletion-mode transistors;
   (h) exposing a portion of the fourth semiconductor layer in the enhancement-mode transistor region and a portion of the sixth layer in the depletion-mode transistor region through the openings in said masking layer;
   (i) performing a first etching treatment through the openings in said masking layer to expose a portion of the third semiconductor layer in the enhancement-mode transistor region and a portion of the fifth semiconductor layer in the depletion-mode transistor region; and
   (j) performing a second etching treatment different from the first etching treatment to expose a portion of the second semiconductor layer in the enhancement-mode transistor region and a portion of the fourth semiconductor layer in the depletion-mode transistor region to form grooves for gate electrodes of the FETs.

2. A method according to claim 1 further comprising the step of forming the gate electrodes by filling the grooves with a conductive material.

3. A method according to claim 1, wherein the second and fourth semiconductor layers are of a semiconductor material and the third and fifth semiconductor layers are of another semiconductor material, and in the second etching treatment step (j) the third and fifth semiconductor layers are easily etched and the second and fourth semiconductor layers are not substantially etched.

4. A method according to claim 3, wherein the second and fourth semiconductor layers are of AlGaAs and the third and fifth semiconductor layers are of GaAs, and the second etching treatment is a reactive ion etching using an etchant gas comprising $CCl_2F_2$.

5. A method according to claim 4, wherein the second AlGaAs layer has a thickness of from 18 to 60 nm.

6. A method according to claim 4, wherein the third GaAs layer has a thickness of from 2 to 50 nm.

7. A method according to claim 4, wherein the fourth AlGaAs layer has a thickness of from 1.5 to 30 nm.

8. A method according to claim 4, wherein the fifth GaAs layer has a thickness of from 40 to 200 nm.

9. A method according to claim 1, wherein the sixth layer is of a semiconductor material.

10. A method according to claim 9 wherein the sixth semiconductor layer is of the same material as the fourth semiconductor layer and in the first etching treatment step (i) at least the fourth and sixth semiconductor layers are etched.

11. A method according to claim 10, wherein the sixth semiconductor layer is of AlGaAs and has a thickness of from 1.5 to 30 nm.

12. A method according to claim 11, wherein the first etching treatment is a wet etching using an etchant solution comprising one from the group consisting of HF and $KI+I_2$.

13. A method according to claim 11, wherein the first etching treatment is a dry etching using an etchant gas comprising one from the group consisting of Ar, He, $H_2$ and $BCl_3$.

14. A method according to claim 9 further comprising the step of forming a seventh semiconductor layer on the sixth semiconductor layer.

15. A method according to claim 14, wherein the seventh, fifth and third semiconductor layers comprise the same first material, and sixth, fourth and second semiconductor layers comprise the same second material.

16. A method according to claim 14 further comprising the step of selectively etching portions of the seventh and sixth semiconductor layers in the enhancement-mode transistor region before the step (g).

17. A method according to claim 16, wherein, in the step (h), the first etching treatment is performed for etching the fifth semiconductor layer in the enhancement-mode transistor region and the seventh semiconductor layer in the depletion-mode transistor region through the openings of said masking layer.

18. A method according to claim 17, wherein the third etching treatment is performed in the same manner as the second etching treatment.

19. A method according to claim 18, wherein the first meterial comprises GaAs compound semiconductor, the second material comprises AlGaAs compound semiconductor, the third and second etching treatment are performed by a reactive ion etching using an etchant gas comprising $CCl_2F_2$.

20. A method according to claim 1, wherein the sixth layer is an insulating material.

21. A method according to claim 20, wherein the first etching treatment (i) comprises a selective etching of the fourth semiconductor layer for exposing the portion of the third semiconductor layer in the enhancement-mode transistor region, and another selective etching of the sixth insulating layer for exposing the portion of the fifth semiconductor layer in the depletion-mode transistor region.

22. A method according to claim 21, wherein said sixth insulating layer is $SiO_2$.

23. A method according to claim 22 further comprising the steps of, after the formation step (f) of the sixth insulating layer, selectively forming another insulating layer on the sixth insulating layer in the depletion-mode transistor region, forming source electrodes and drain electrodes for the enhancement-mode and depletion-mode transistors, forming the masking layer of a resist film with openings corresponding to gate electrodes of the transistors, and etching the sixth insulating layer and the fifth semiconductor layer through one opening in said masking layer in the enhance-ment-mode transistor region.

24. A method according to claim 23, wherein the other insulating layer is $Si_3N_4$.

25. A method according to claim 24, wherein the other insulating layer is etched through the other opening in said masking layer, before the selective etching of the sixth insulating layer.

26. A method according to claim 22 further comprising the steps of, after the formation step (f) of the sixth insulating layer, decreasing the thickness of the sixth insulating layer in the enhancement-mode transistor region by etching, forming source electrodes and drain electrodes for the enhancement-mode and depletion-mode transistors through the sixth insulating layer, forming the masking layer of a resist film with openings corresponding to gate electrodes of the transistors, etching the decreased sixth insulating layer and the fifth semiconductor layer through the openings in said masking layer in the enhancement-mode transistor region and a portion of the sixth insulating layer in the depletion-mode transistor region to decrease the thickness thereof.

* * * * *